United States Patent
Yamamoto et al.

(10) Patent No.: US 10,872,745 B2
(45) Date of Patent: Dec. 22, 2020

(54) CHARGED-PARTICLE BEAM SYSTEM

(71) Applicant: Hitachi High-Technologies Corporation, Tokyo (JP)

(72) Inventors: Akio Yamamoto, Tokyo (JP); Kazuki Ikeda, Tokyo (JP); Wen Li, Tokyo (JP); Hiroyuki Takahashi, Tokyo (JP); Shahedul Hoque, Tokyo (JP); Shunsuke Mizutani, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/494,454

(22) PCT Filed: Mar. 27, 2017

(86) PCT No.: PCT/JP2017/012250
§ 371 (c)(1),
(2) Date: Sep. 16, 2019

(87) PCT Pub. No.: WO2018/179029
PCT Pub. Date: Oct. 4, 2018

(65) Prior Publication Data
US 2020/0020504 A1    Jan. 16, 2020

(51) Int. Cl.
*H01J 37/22* (2006.01)
*H01J 37/244* (2006.01)
*H01J 37/28* (2006.01)

(52) U.S. Cl.
CPC .......... *H01J 37/222* (2013.01); *H01J 37/244* (2013.01); *H01J 37/28* (2013.01); *H01J 2237/2443* (2013.01)

(58) Field of Classification Search
None
See application file for complete search history.

(56) References Cited

U.S. PATENT DOCUMENTS

2012/0025074 A1    2/2012  Barbi et al.

FOREIGN PATENT DOCUMENTS

JP          2013541799 A    11/2013
JP    WO2017109843 A1 *    9/2018    ............ H01J 37/244

\* cited by examiner

*Primary Examiner* — Andrew Smyth
(74) *Attorney, Agent, or Firm* — Miles & Stockbridge, P.C.

(57) ABSTRACT

A charged-particle beam system comprises: a charged-particle beam device containing a detection unit for detecting electrons generated by irradiating a sample with a charged-particle beam released from a charged particle source; and a signal detection unit in which a detection signal from the detection unit is input through a wiring. The signal detection unit comprises: a separation unit for separating into a rising signal and a falling signal the detection signal from the detection unit; a falling signal processing unit for at least eliminating ringing in the falling signal; and a combination unit generating and delivering a combined signal produced by combining the rising signal, which has been separated by the separation unit, with the falling signal wherefrom the ringing has been eliminated by the falling signal processing unit.

9 Claims, 4 Drawing Sheets

[FIG. 1]
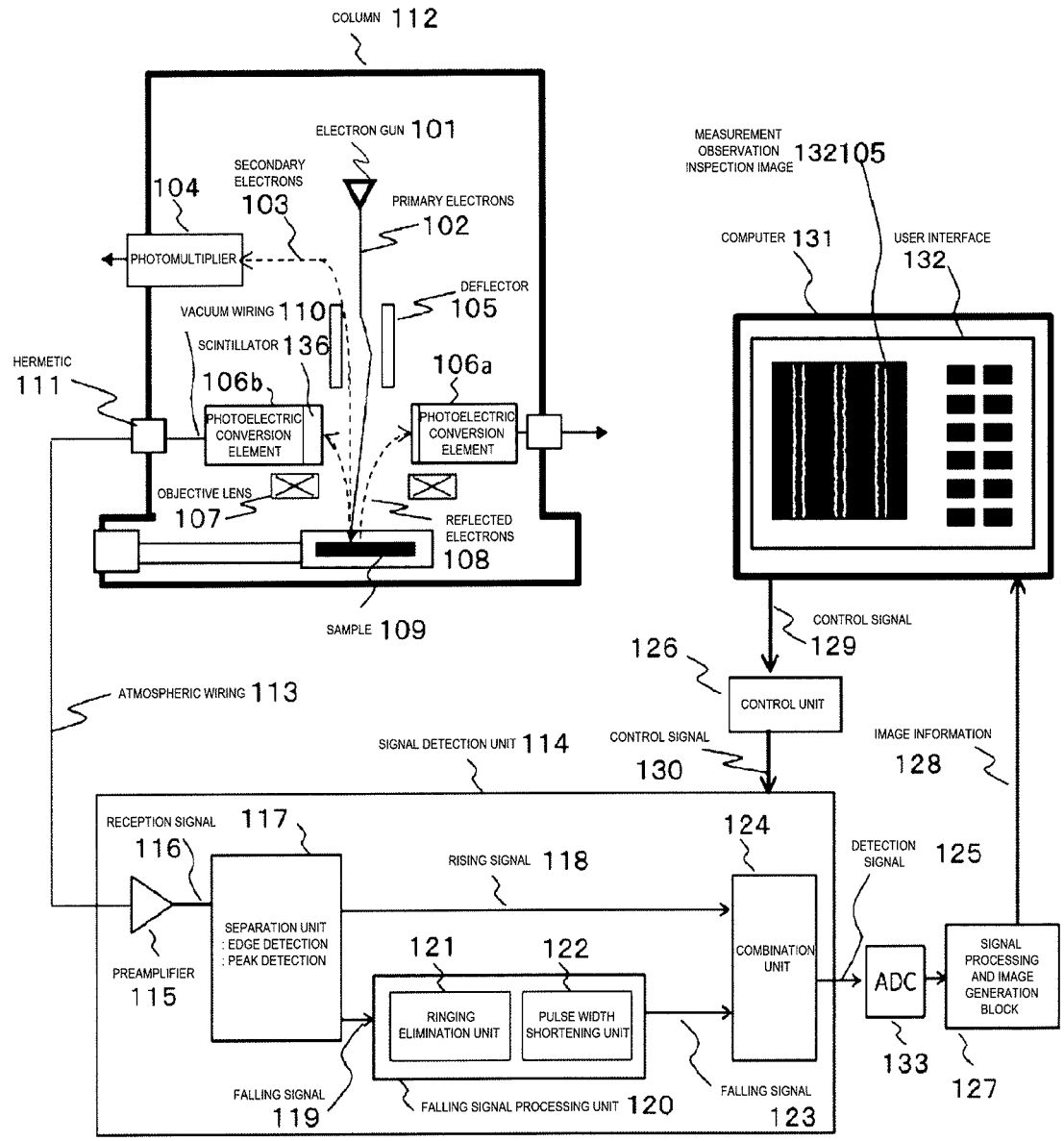

[FIG. 2]
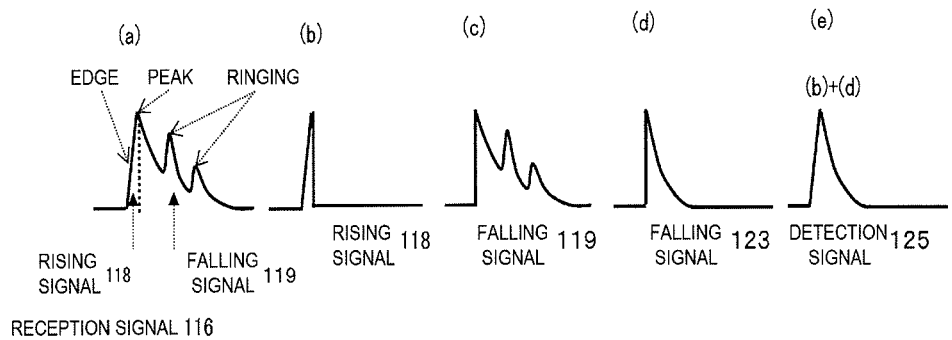
[FIG. 3]
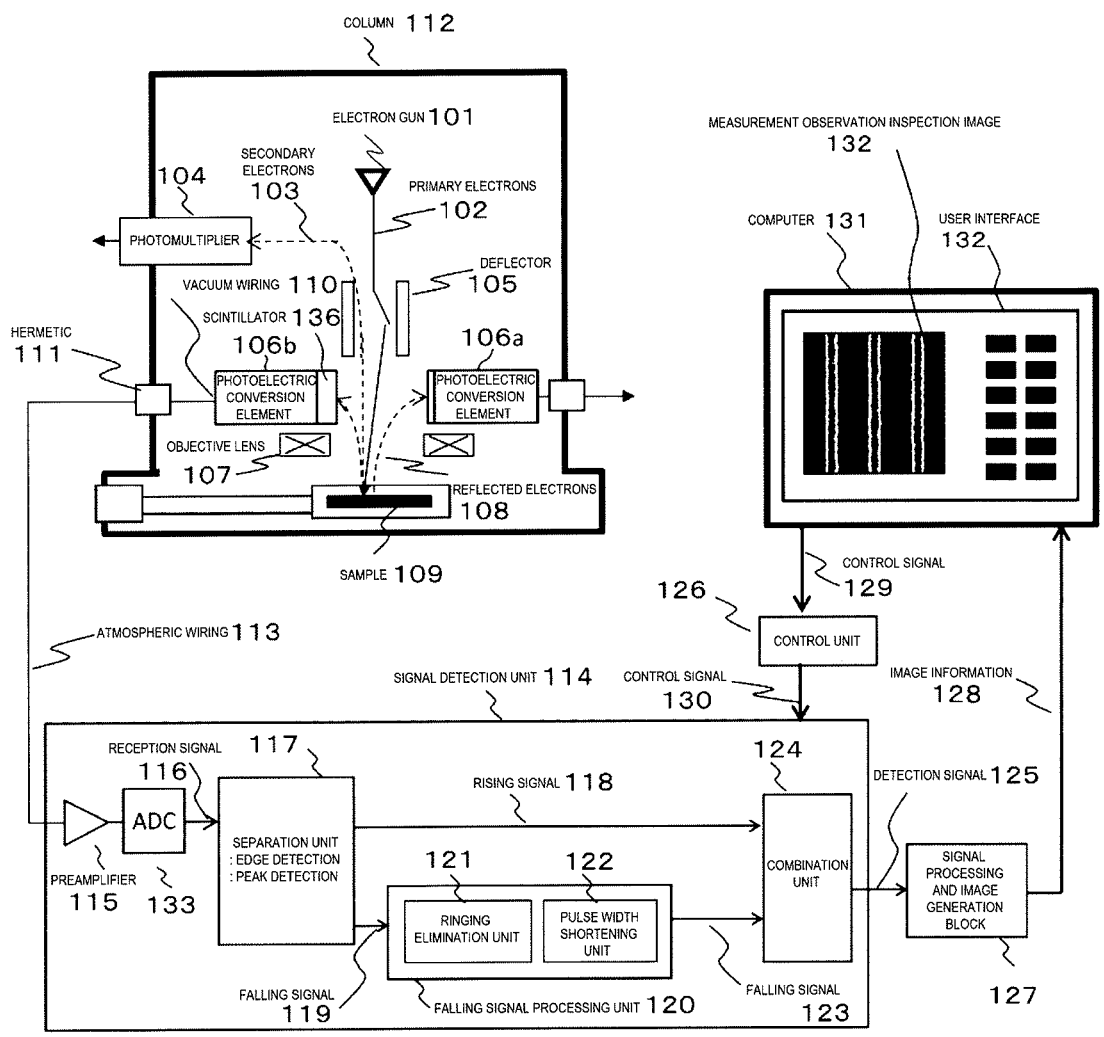

[FIG. 4A]
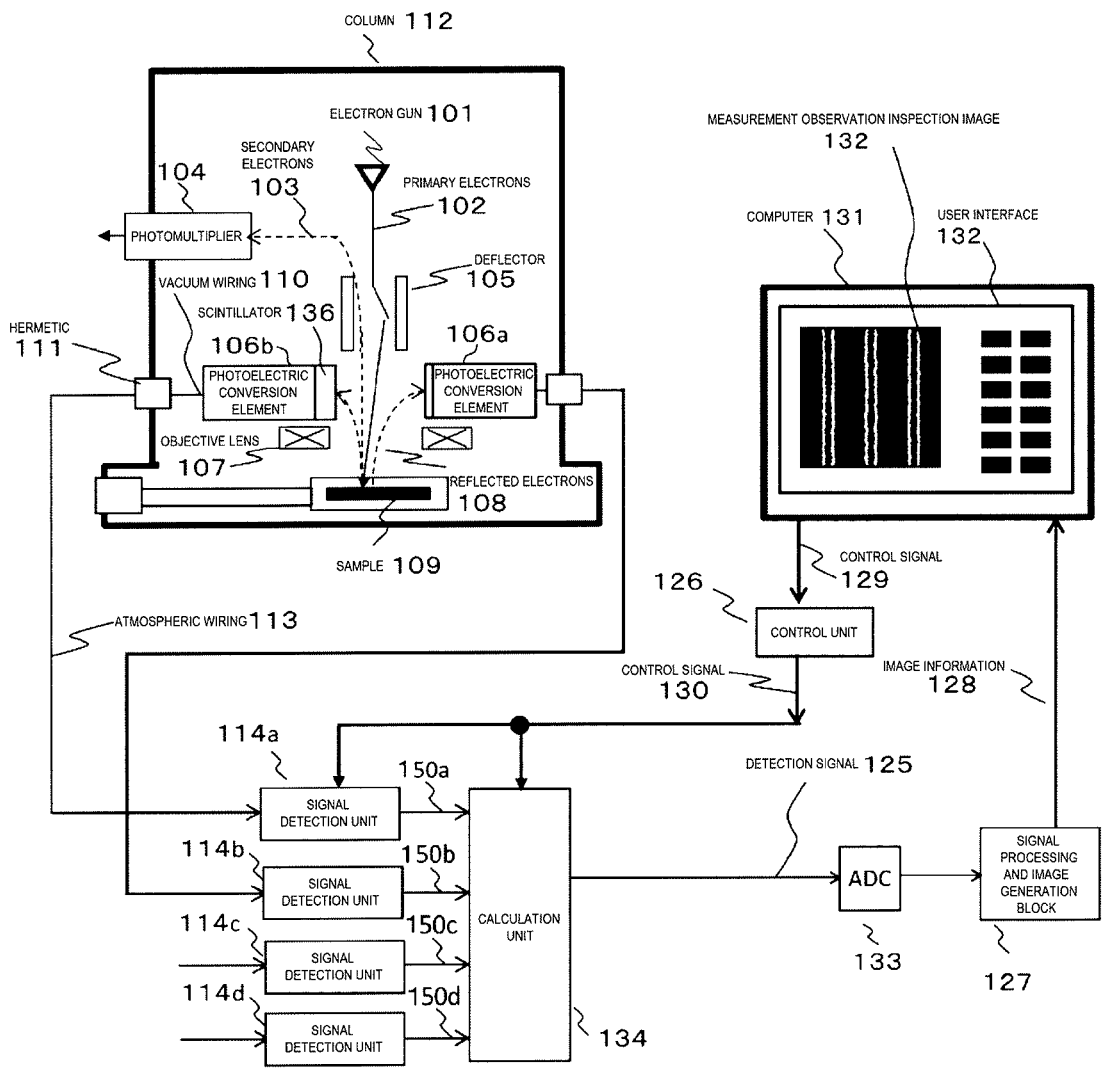
[FIG. 4B]
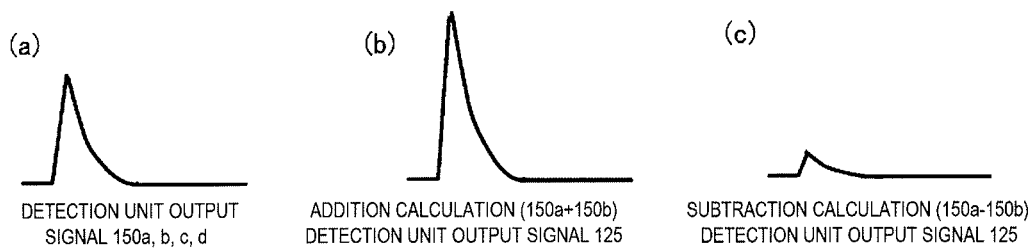

[FIG. 5A]
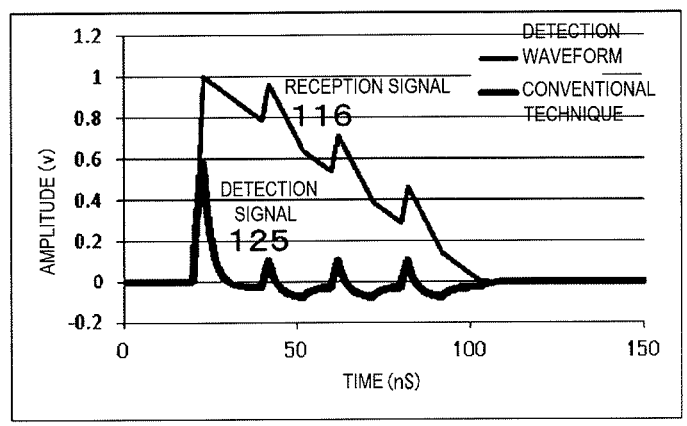
CONVENTIONAL METHOD
[FIG. 5B]
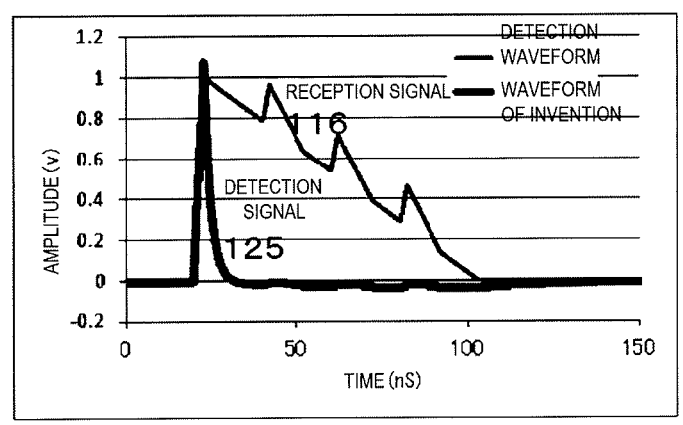
EMBODIMENTS

CHARGED-PARTICLE BEAM SYSTEM

TECHNICAL FIELD

The present invention relates to a charged-particle beam system.

BACKGROUND ART

A scanning electron microscope is usually used as an evaluation and measurement device for a semiconductor device. In measurement using a scanning electron microscope, when a sample is irradiated with a primary electron beam, signal electrons having various energies are emitted in various directions due to the interaction between the electrons and the sample. The signal electrons have different information related to the sample in accordance with an emission energy and an emission angle, and various measurements can be made by distinguishing and detecting the signal electrons.

In general, signal electrons emitted at an energy of 50 eV or less are referred to as secondary electrons, signal electrons emitted at an energy larger than 50 eV and close to the energy of the primary electron beam are referred to as reflected electrons, and thus the signal electrons are distinguished.

In general, electrons out of a sample by irradiating the sample with a primary electron beam are referred to as secondary electrons. In addition, electrons reflected from the sample by irradiating the sample with the primary electron beam are referred to as reflected electrons. The secondary electrons and the reflected electrons are handled separately as signal electrons. Therefore, the performance of the scanning electron microscope can be improved by imaging information obtained by capturing not only the secondary electrons but also the reflected electrons.

Further, as a distinguishing method, the signal electrons are distinguished as follows: signal electrons emitted at an energy of 50 eV or less are referred to as secondary electrons, signal electrons emitted at an energy larger than 50 eV and close to the energy of the primary electron beam are referred to as reflected electrons.

PTL 1 discloses a technique of using a semiconductor element as a detector to detect reflected electrons and inputting a detection signal from the detector to an external control system to create an electronic image on a display system.

PRIOR ART LITERATURE

Patent Literature

PTL 1: JP-T-2013-541799

SUMMARY OF INVENTION

Technical Problem

Since the number of the reflected electrons is smaller than that of the secondary electrons, it is important to capture the reflected electrons in the vicinity of the sample as much as possible in order to sufficiently supplement the reflected electrons for imaging. As a detector that can be disposed in the vicinity of the sample, it is preferable to use a semiconductor element such as a photoelectric conversion element.

However, when the photoelectric conversion element is used as a detector for the reflected electrons, a signal processing circuit of a detection signal from the photoelectric conversion element is disposed in the atmosphere outside a vacuum column to prevent contamination in the vacuum column of the scanning electron microscope. Therefore, it is necessary to connect the photoelectric conversion element and the signal processing circuit through a long-distance wiring.

In this case, impedance matching between the output impedance of the photoelectric conversion element and the input impedance of the signal processing circuit becomes difficult since the output impedance of the photoelectric conversion element changes with an output current.

Thus, reflection generates between the photoelectric conversion element and the signal processing circuit connected through a wiring, and a detection signal from the photoelectric conversion element repeats reflection between the photoelectric conversion element and the signal processing circuit. As a result, the reflected signal is superimposed on the detection signal from the photoelectric conversion element, and ringing (saw-like noise) is generated at the falling of a detection waveform. When such ringing is generated, noise is generated in an inspection image, which makes it difficult to accurately measure and observe the inspection image.

PTL 1 does not mention the problem that the ringing is generated at the falling of the detection waveform and it is difficult to accurately measure and observe the inspection image due to the ringing, and a solution thereof.

An object of the invention is to accurately measure and observe an inspection image in a charged-particle beam system.

Solution to Problem

A charged-particle beam system according to one aspect of the invention includes: a charged-particle beam device that includes a detection unit that detects electrons generated by irradiating a sample with a charged-particle beam released from a charged particle source; and a signal detection unit in which a detection signal from the detection unit is input through a wiring. The signal detection unit includes: a separation unit that separates the detection signal from the detection unit into a rising signal and a falling signal; a falling signal processing unit that at least eliminates ringing in the falling signal; and a combination unit that generates and outputs a combined signal produced by combining the rising signal, which has been separated by the separation unit, with the falling signal wherefrom the ringing has been eliminated by the falling signal processing unit.

Advantageous Effect

According to the invention, an inspection image can be accurately measured and observed in a charged-particle beam system.

BRIEF DESCRIPTION OF DRAWINGS

FIG. 1 is a diagram showing a configuration of a charged-particle beam system of a first embodiment.

FIG. 2 is a diagram showing an example of a signal waveform.

FIG. 3 is a diagram showing a configuration of a charged-particle beam system of a second embodiment.

FIG. 4A is a diagram showing a configuration of a charged-particle beam system of a third embodiment.

FIG. 4B is a diagram showing a waveform (a) of an output signal of a signal detection unit, a waveform (b) of the output signal of the signal detection unit during addition calculation, and a waveform (c) of the output signal of the signal detection unit during subtraction calculation.

FIG. 5A is a diagram showing a simulation result of the detection signal of a related method, and FIG. 5B 9 is a diagram showing a simulation result of the detection signal of the embodiments.

DESCRIPTION OF EMBODIMENTS

Hereinafter, embodiments will be described with reference to the drawings.

First Embodiment

A charged-particle beam system of the first embodiment will be described with reference to FIGS. 1 and 2.

As shown in FIG. 1, an electron gun (charged particle source) 101 is disposed inside an electron microscope column (charged-particle beam device) 112 in a vacuum environment, and primary electron beams 102 released from the electron gun 101 fly along a primary electron beam optical axis. A trajectory of the primary electron beams 102 is adjusted by a deflector 105, and the primary electron beam is focused on a sample 109 by an objective lens 107.

A negative voltage is applied to the sample 109, and the primary electrons 102 collide with the sample with an energy smaller than the energy generated by the electron gun 101. Reflected electrons 108 and secondary electrons 103 generated from the sample by the collision of the primary electrons 102 fly within the electron microscope column 112 in accordance with an emission energy and an emission angle respectively.

Here, electrons out of the sample 109 by irradiating the sample 109 with the primary electron beams 102 are secondary electrons, and electrons reflected from the sample 109 by irradiating the sample 109 with the primary electron beams 102 are reflected electrons.

When the reflected electrons 108 collide with a scintillator 136, the reflected electrons 108 are converted into light, and the light is converted into a detection current by photoelectric conversion elements 106a, 106b. As the photoelectric conversion elements 106a, 106b, for example, a semiconductor element such as a photodiode or a semiconductor photodetector (Si-PM: silicon photomultiplier) or a photomultiplier 104 is used. The detection current is transmitted to a signal detection unit 114 through a vacuum wiring 110, a hermetic 111 and an atmospheric wiring 113.

In the signal detection unit 114, the detection signal of the photoelectric conversion elements 106a, 106b is converted into a reception signal 116 through a preamplifier 115 and is input to a separation unit 117. The separation unit 117 performs rising edge detection and peak detection of the reception signal 116, and a rising signal 118 obtained by the edge detection and peak detection is input to a combination unit 124.

Further, the separation unit 117 outputs a falling signal 119 obtained by the edge detection and peak detection. The falling signal 119 is input to a falling signal processing unit 120. In the falling signal processing unit 120, a ringing elimination unit 121 eliminates ringing of the falling signal 119, and a pulse width shortening unit 122 shortens a pulse width of the falling signal 119 to speed up the falling time.

The ringing elimination unit 121 eliminates the ringing generated in the falling signal by superimposing on the detection signal a reflected signal generated by the detection signal of the photoelectric conversion elements 106a, 106b being reflected between the photoelectric conversion elements 106a, 106b and the signal detection unit 114 through the atmospheric wiring 113.

The falling signal processing unit 120 eliminates the ringing, and outputs the falling as a fast falling signal 123 to the combination unit 124. The combination unit 124 combines the rising signal 118 and the falling signal 123 and outputs the combined signal as a detection signal 125.

Here, FIG. 2 shows a schematic view of each signal. The reception signal 116 of (a) has a high speed rising but a slow falling, and a ringing generated by reflection between the photoelectric conversion elements 106a, 106b and the preamplifier 115 is superimposed on the falling. The rising signal 118 of (b) is a signal obtained by separating the high speed rising portion, and the falling signal 119 of (c) is a signal in which the falling time is long and ringing is superimposed. In the falling signal 123 of (d), the ringing is eliminated and the falling is also at a high speed. The detection signal 125 of (e) obtained by combining the rising signal 118 of (b) and the falling signal 123 of (d) is a signal in which the ringing of the falling of the reception signal 116 is eliminated and the falling is at a high speed.

The ringing elimination unit 121 is configured with, for example, a high pass filter or an integrator. Further, the pulse width shortening unit 122 is configured with, for example, a low pass filter or a differentiator.

The detection signal 125 is converted into a digital signal by an ADC converter 133, converted into image information 128 in a signal processing and image generation block 127, and displayed on a computer 131 as a measurement observation inspection image 132. Further, items set in a user interface 132 of the computer 131 enter a control unit 126 as a control signal 129. Then, the items are output, as a control signal 130, from the control unit 126 to the signal detection unit 114 and various parameter settings are performed.

In the first embodiment, the rising and falling of the detection waveform are subjected to separate processing. The falling signal is speeded up after the ringing processing, and is combined with the rising signal. Accordingly, a detection waveform without ringing can be obtained.

In the embodiment, the case where the reflected electrons 108 collide with the scintillator 136 is described, but the same effect can also be obtained in a case where the secondary electrons 103 collide with the scintillator 136 and are converted into light.

Second Embodiment

A charged-particle beam system of a second embodiment will be described with reference to FIG. 3.

As shown in FIG. 3, the signal processing of the first embodiment of FIG. 1 is performed by converting the detection signal transmitted to the signal detection unit 114 through the atmospheric wiring 113 into a digital signal by the ADC 133 at a stage subsequent to the preamplifier 115 and performing the digital signal processing. The waveform of each portion is a digital signal obtained by sampling and quantizing the waveform shown in FIG. 2 by the ADC 133. Other configurations are the same as those of the charged-particle beam system of the first embodiment, so that a description thereof will be omitted.

In the second embodiment, the processing of the separation unit 117, the ringing elimination unit 121, the pulse width shortening unit 122, and the combination unit 124 can be realized by the digital signal processing. Thus, for example, when there are a plurality of signal detection units 114 as shown in FIG. 4A, it is possible to realize stable signal processing without being affected by performance variation in the plurality of signal detection units 114 and environmental changes such as temperature. Furthermore, downsizing integration can be realized by LSI.

Third Embodiment

A charged-particle beam system of a third embodiment will be described with reference to FIG. 4A and FIG. 4B.

FIG. 4A shows an embodiment in a case where semiconductor light conversion elements such as a plurality of photoelectric conversion elements 106 are disposed in the electron microscope column 112. In this case, the detection signal through the atmospheric wiring 113 includes signal detection units 114 in a number corresponding to the number of the photoelectric conversion elements 106 as signal detection units 114a to 114d, and output signals 150a to 150d of the signal detection units 114a to 114d are added and subtracted by a calculation unit 134. A result of the addition and subtraction calculation is output as a detection signal 125. Then, the detection signal 125 is input to the ADC 133.

(a), (b), and (c) of FIG. 4B show waveform examples of the detection unit output signal and the detection signal 125 during the addition and subtraction calculation. As shown in (b), the amplitude of the detection unit output signal is increased during an addition calculation. Further, as shown in (c), the amplitude of the detection unit output signal is decreased during a subtraction calculation. A user operates the user interface 132 so as to obtain an optimal image while viewing the measurement observation inspection image 132 displayed on the computer 131. Accordingly, the control signal 129 from the computer 131 enters the control unit 126. Then, the calculation unit 134 is controlled by the control signal 130 from the control unit 126. In this way, it is possible to switch the calculation between the addition calculation and the subtraction calculation.

Further, the plurality of photoelectric conversion elements 106a, 106b disposed in the electron microscope column 112 have variations in gain and delay time, and also vary in the gain and delay time depending on the surrounding environment such as temperature. In order to correct the variation, the control signal 129 from the user interface 132 is input to the control unit 126. Then, the control signal 130 from the control unit 126 is input to the signal detection units 114a to 114d, and settings for parameters such as gain and delay time are performed. Other configurations are the same as those of the charged-particle beam system of the first embodiment, so that a description thereof will be omitted.

According to the third embodiment, the variation of the plurality of photoelectric conversion elements 106 in the electron microscope column 112 can be adjusted. Further, by adjusting the calculation in the calculation unit 134 with the user interface 132, high image quality can be obtained.

FIG. 5 shows a simulation result FIG. 5A of a related method without the falling signal processing unit 120 and a simulation result FIG. 5B of the embodiments having the falling signal processing unit 120.

In the related method of FIG. 5A, it can be seen that a peak amplitude of the detection signal 125 decreases and ringing of the falling remains. In contrast, in the embodiments of FIG. 5B, it can be seen that the detection signal 125 falls at a high speed and ringing of the falling is eliminated.

REFERENCE SIGN LIST 112 electron microscope column
101 electron gun
102 primary electron
105 deflector
106 photoelectric conversion element
107 objective lens
108 reflected electron
109 sample
110 vacuum wiring
113 atmospheric wiring
114 signal detection unit
127 signal processing and image generation block
131 computer
126 control unit
117 separation unit
120 falling signal processing unit
124 combination unit

The invention claimed is:

1. A charged-particle beam system, comprising:
a charged-particle beam device that includes a detection unit that detects electrons generated by irradiating a sample with a charged-particle beam released from a charged particle source; and
a signal detection unit in which a detection signal from the detection unit is input through a wiring, wherein the signal detection unit includes
a separation unit configured to separate the detection signal from the detection unit into a rising signal and a falling signal,
a falling signal processing unit configured to eliminate ringing in the falling signal, and
a combination unit configured to generate and output a combined signal produced by combining the rising signal, which has been separated by the separation unit, with the falling signal wherefrom the ringing has been eliminated by the falling signal processing unit.

2. The charged-particle beam system according to claim 1, wherein
the falling signal processing unit includes:
a ringing elimination unit that eliminates the ringing of the falling signal, and
a pulse width shortening unit that shortens a pulse width of the falling signal.

3. The charged-particle beam system according to claim 1, wherein
the separation unit detects a rising edge and peak of the detection signal and separates the detection signal into the rising signal and the falling signal.

4. The charged-particle beam system according to claim 2, wherein
the ringing elimination unit eliminates the ringing generated in the falling signal by superimposing on the detection signal a reflected signal generated by the detection signal being reflected between the detection unit and the signal detection unit through the wiring.

5. The charged-particle beam system according to claim 2, wherein
the ringing elimination unit is configured with a high pass filter or an integrator, and
the pulse width shortening unit is configured with a low pass filter or a differentiator.

6. The charged-particle beam system according to claim 1, wherein the signal detection unit includes an A/D conversion unit that converts the detection signal from the detection unit into a digital signal and outputs the converted digital signal to the separation unit.

7. The charged-particle beam system according to claim 1, further comprising a calculation unit, wherein the charged-particle beam device includes a plurality of the detection units, and detection signals from the plurality of detection units are respectively input to the plurality of signal detection units, and the calculation unit performs addition calculation or subtraction calculation on output signals from the plurality of signal detection units and outputs the obtained signals.

8. The charged-particle beam system according to claim 1, wherein the detection unit of the charged-particle beam device is disposed in a vacuum, and the signal detection unit is disposed in the atmosphere.

9. The charged-particle beam system according to claim 1, wherein the detection unit of the charged-particle beam device detects reflected electrons reflected from the sample as electrons generated by irradiating the sample with the charged-particle beam.

\* \* \* \* \*